United States Patent [19]

Palmer et al.

[11] Patent Number: 5,027,061
[45] Date of Patent: Jun. 25, 1991

[54] ELECTROMAGNETIC AND THERMAL SHIELD FOR ELECTRONIC ENERGY METER

[75] Inventors: Ansell W. Palmer, Hampton; Peter F. Coryea, Salem, both of N.H.

[73] Assignee: General Electric Company, Somersworth, N.H.

[21] Appl. No.: 412,353

[22] Filed: Sep. 25, 1989

[51] Int. Cl.⁵ .......................... G01R 1/04; H05K 9/00
[52] U.S. Cl. ................................. 324/156; 324/110; 174/35 MS; 361/372
[58] Field of Search .................. 324/156, 110, 117 R, 324/127; 333/12; 174/35 MS; 361/372; 307/91; 336/84 M

[56] References Cited

U.S. PATENT DOCUMENTS

| | | | |
|---|---|---|---|
| 4,744,004 | 5/1988 | Hammond | 361/372 |
| 4,760,333 | 7/1988 | Ichimura et al. | 324/156 X |
| 4,795,975 | 1/1989 | Cox | 324/156 |

Primary Examiner—Kenneth Wieder
Assistant Examiner—Jack B. Harvey
Attorney, Agent, or Firm—Robert E. Brunson; Irving M. Freedman

[57] ABSTRACT

An electromagnetic and thermal shield for an electronic energy meter which includes a base, a register and intermediate electronics. The tapered form fitting shield extends from the register to the base and includes intermediate resilient fasteners formed from the shield to position, secure, and shield the components of the meter.

46 Claims, 3 Drawing Sheets

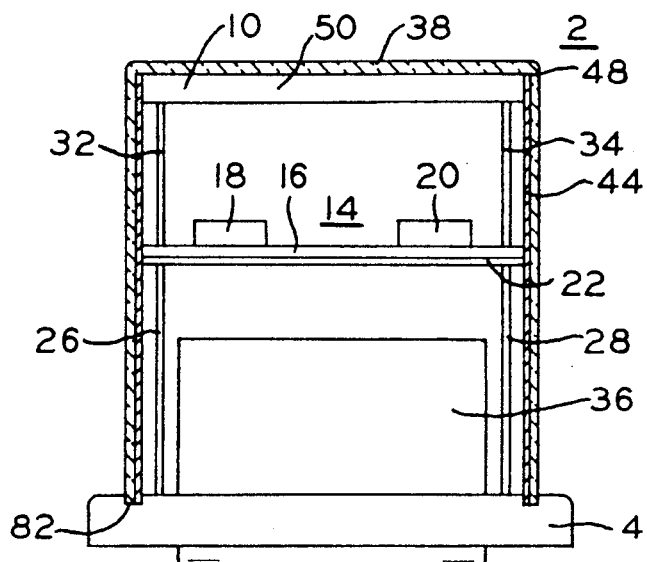
FIG_1
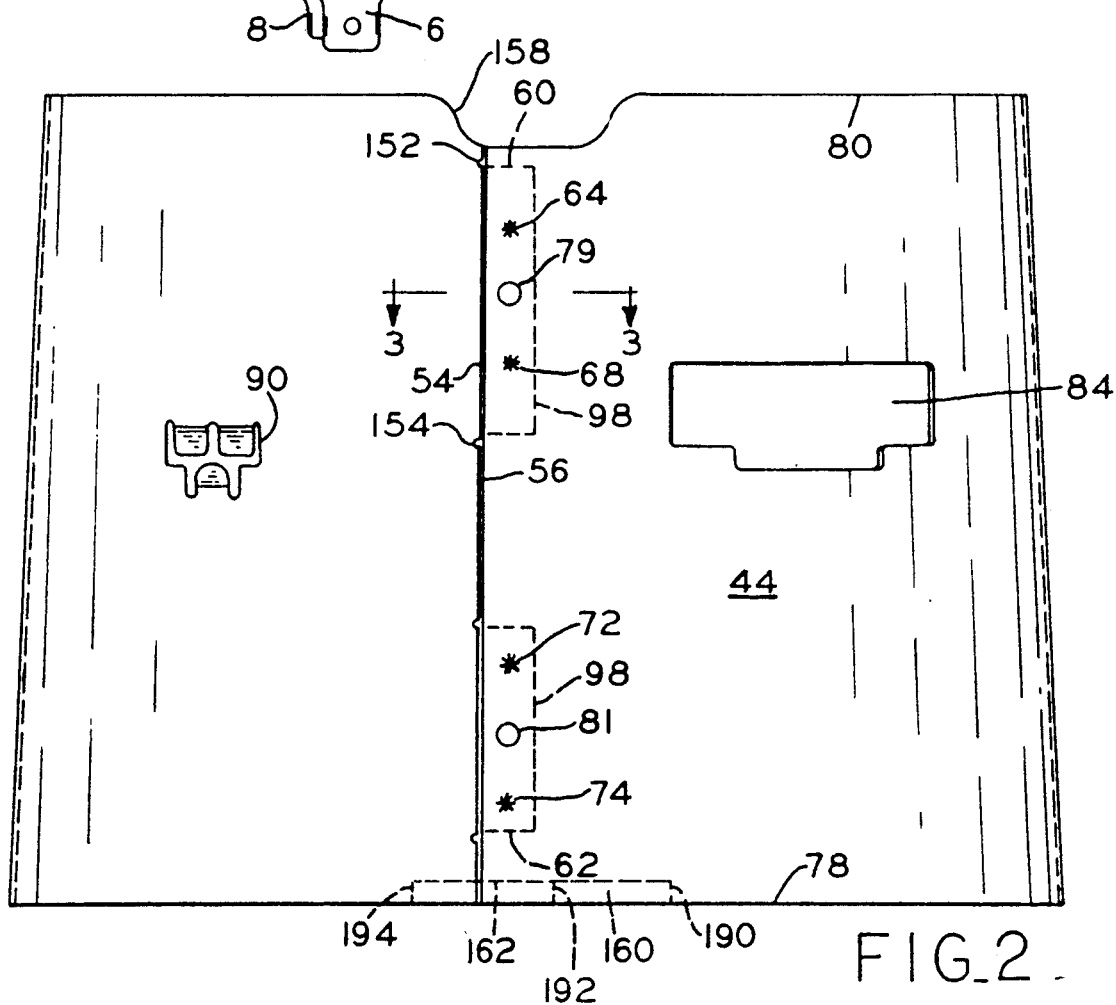
FIG_2
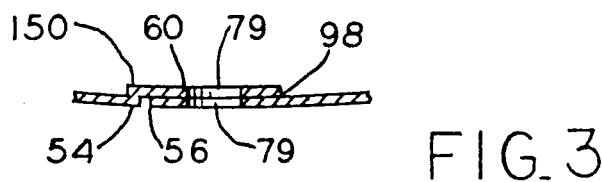
FIG_3

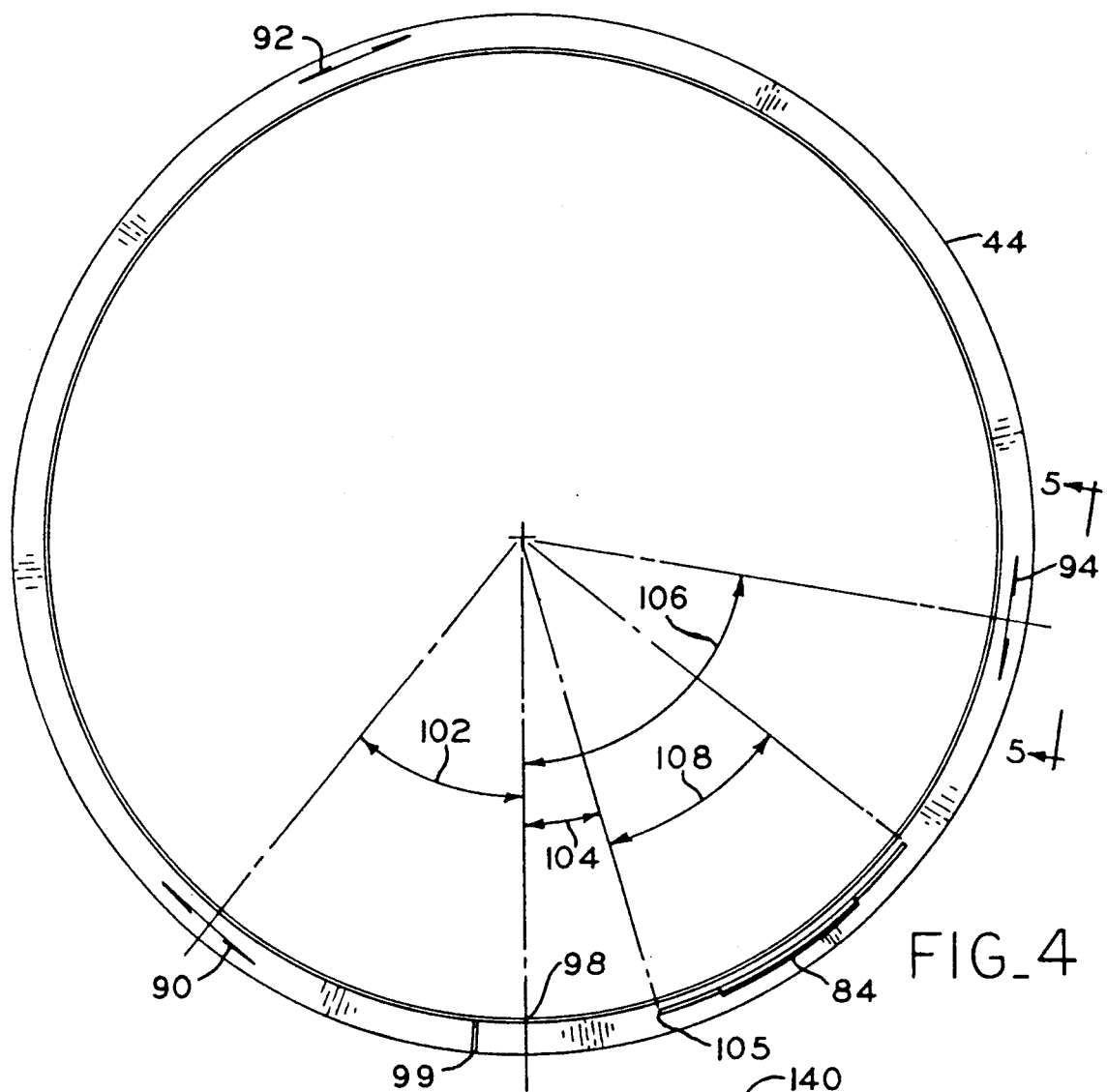
FIG_4
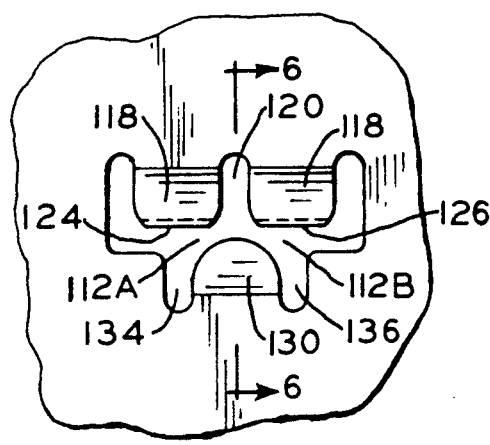
FIG_5
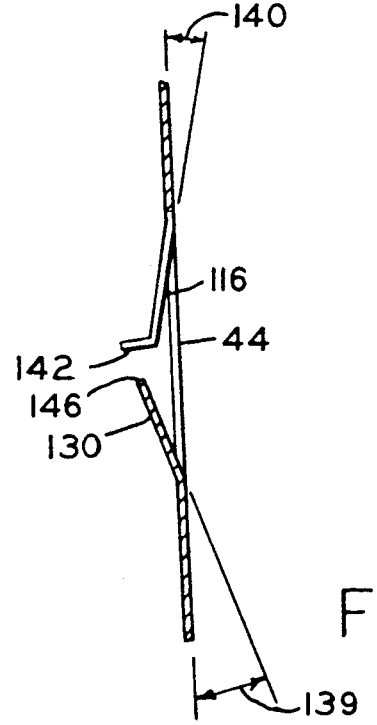
FIG_6

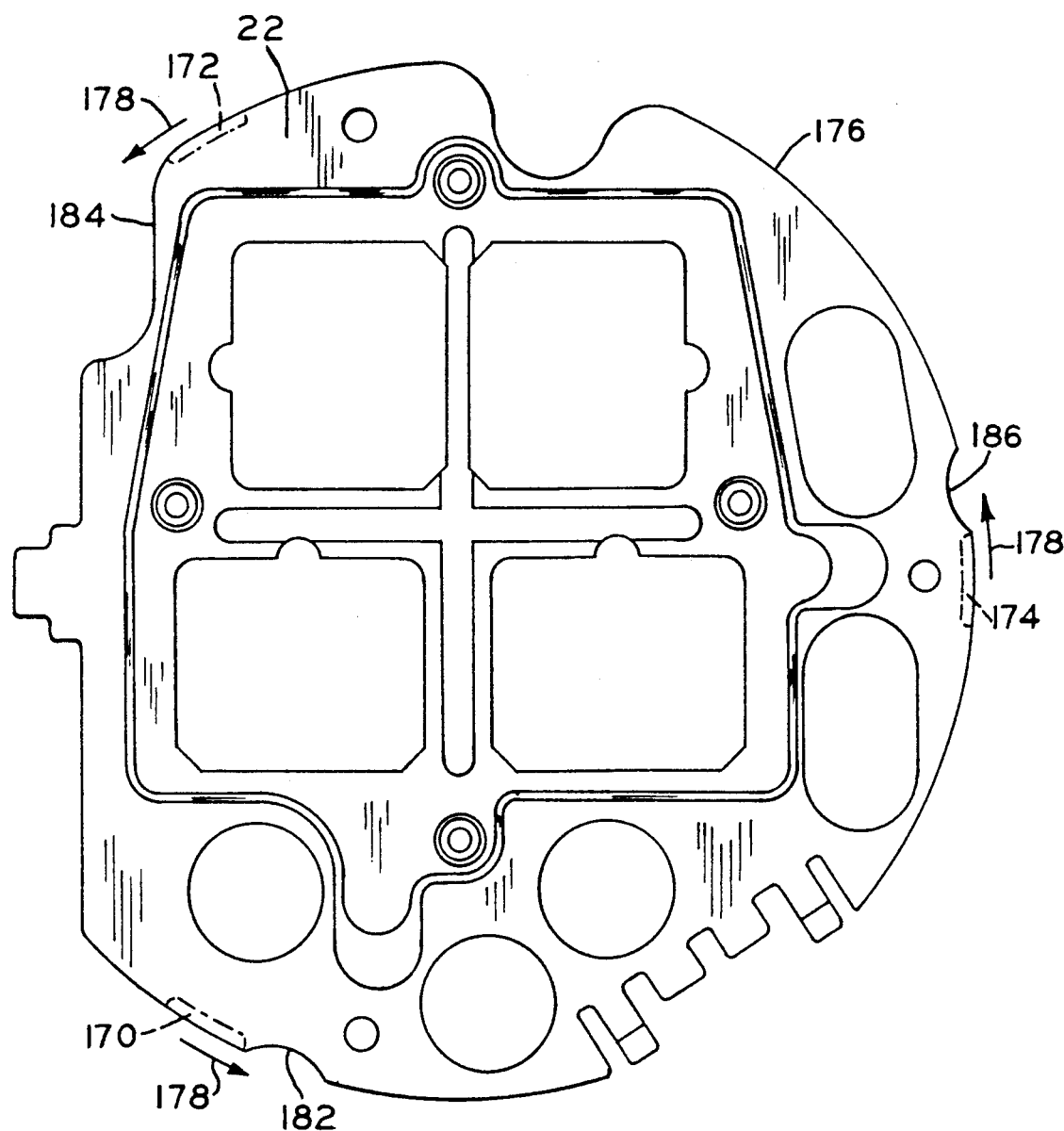
FIG_7

5,027,061

ELECTROMAGNETIC AND THERMAL SHIELD FOR ELECTRONIC ENERGY METER

BACKGROUND OF THE INVENTION

The present invention relates to an electromagnetic and thermal shield for an energy meter having a transparent glass or polycarbonate housing, particularly where the energy meter is of the electronic type.

Energy meters are installed and utilized in millions of different locations, many of which are exposed to very high temperatures, including direct sunlight, and also exposed to electromagnetic interference which could adversely affect the operation of the electronic energy meter. Direct sunlight shining through the transparent housing results in a greenhouse effect in which the interior of the energy meter tends to reach extremely high temperatures, much higher than the ambient temperature outside the meter.

While it is conventional to have a transparent housing for an energy meter to permit the reading of the visual displays of the energy meter by the customer or meter reader, it is not desirable to have the component parts, including the electronics of the meter, visible from the outside, not only from a heat and electromagnetic radiation point of view, but also from an aesthetic point of view.

Various approaches to providing electromagnetic and thermal shields for energy meters have been proposed or utilized, including that disclosed, for example, by U.S. Pat. No. 4,795,975 in which a thermal and electromagnetic shield is fabricated of organic layers bonded to a foil layer through use of intermediate adhesives. The resultant pliable thermal and electromagnetic shield presents possible problems of grounding, retention of shape, and concern that the pliable shield might accidentally make electrical contact with voltages within the energy meter. It is desirable that the electromagnetic and thermal shield be rigid and provide a positive ground on contact.

In addition, the energy meter may be constructed in a layered configuration, that is, with a base assembly and a register or meter assembly spaced from the base assembly with an intermediate electronic layer. In such meters means must be provided to support these multiple layers relative to one another, and also to prevent dangerous shock from the voltages present within, and between, these layers when the cover is removed, for example, to actuate certain test or other functions built into the meter.

OBJECTS AND SUMMARY OF INVENTION

One object of the present invention is to provide an improved thermal and electromagnetic shield for an energy meter.

Another object of the present invention is to provide an electromagnetic and thermal shield for an electronic energy meter which is readily grounded, is non-transparent, and heat-reflective.

Still another object of the present invention is to provide a thermal and electromagnetic shield for an electronic energy meter which is readily assembled and disassembled and which provides rigidity and support to the multiple layers of components within the electric energy meter, and which also acts as a safety shield when the cover of the meter is removed.

In accordance with a preferred embodiment of the present invention, an electromagnetic and thermal shield is provided for an electronic energy meter including a base for connection in circuit with the power source and load to be metered, a register spaced from the base, intermediate electronics, and a transparent cover. The tapered shield extends from the register to a rim in the base and includes intermediate resilient teeth formed from the shield to grip contact portions on a transverse support member between the base and register. The teeth extend inwardly from the shield and include rounded teeth on the bottom with the opposed top teeth having a flatted portion with a tab extending parallel to the base, to position and secure the shield and to provide shielding and support for the components of the meter. The shield is formed of sheet steel with the grain parallel to the base and with a smooth outer seam perpendicular to the base provided by offset welded tabs which pass under the seam.

DESCRIPTION OF THE DRAWINGS

FIG. 1 is a simplified drawing of a cross section of an electronic energy meter incorporating the invention.

FIG. 2 is an enlarged view of the electromagnetic and thermal shield of FIG. 1 and including an angular positioning guide.

FIG. 3 is an enlarged view showing the seam of the electromagnetic and thermal shield of FIGS. 1 and 2.

FIG. 4 is a top view of the electromagnetic and thermal shield of FIG. 3.

FIG. 5 is an enlarged view showing the fastener for securing the electromagnetic and thermal shield to an intermediate layer of the energy meter.

FIG. 6 is an enlarged side view of the fastener shown in FIG. 5.

FIG. 7 is a top view of the plate in the intermediate layer of the energy meter to which the electromagnetic and thermal shield is fastened.

Referring to FIG. 1, an electronic energy meter 2 is shown in simplified form and includes a base 4 having a plurality of meter circuit terminals such as 6 and 8 extending through the base 4 to connect the meter in circuit with a power source and a load which is to be metered. A register 10 including a digital readout (not shown) is positioned at the other end of the energy meter 2, with an intermediate electronic voltage assembly 14 including a printed circuit board 16 carrying electronic components shown generically as 18 and 20 and supported by transverse support member 22 which, in turn, is supported by spacers such as 26 and 28 interposed between the base 4 and the transverse support member 22. Support members 32 and 34 are interposed between the transverse support member 22 and the register 10. The base 4 also supports the current transformers or sensors shown generally as 36. A transparent cover or housing 38 surrounds the meter components, and in combination with the base 4 encloses the assembly. The transparent cover housing 38 is commonly made of glass or a transparent polycarbonate.

Details of the construction of an electronic energy meter 2 which incorporates the present invention are set forth in copending U.S. patent application, Ser. No. 411,934 filed by W. R. Germer, M. J. Ouellette, D. F. Bullock and A. F. Palmer, assigned to the same assignee as the present invention and hereby incorporated by reference.

As discussed above, the "greenhouse" effect of the transparent cover tends to build up extremely high temperatures within such an energy meter. In order to minimize such temperatures, and also to isolate the electronic components such as 18 and 20 and those associated with the register 10 from electromagnetic interference, an electromagnetic interference (EMI) and heat shield 44 is positioned around the energy meter components and within a transparent housing 38.

The EMI and thermal shield 44 is generally cylindrical in shape and extends between a shoulder or step 82 in base 4, and the top edge 48 of the molded bezel 50 associated with the register 10. The EMI and thermal shield 44 is shown in FIGS. 2-6. Referring first to FIG. 2, the EMI and thermal shield 44 is formed of sheet brushed finish stainless steel, 0.010 inches thick, punched and fabricated to the shape shown, with the ends curved around to meet one another to form a cylindrical sleeve. The axial edges or ends 54 and 56 are drawn around to meet, with the tabs 60 and 62 which extend out from axial end 54 being positioned under the axial end 56. The ends 54 and 56 are held in place by spot welds 64 and 68 for tab 60, and spot welds 72 and 74 for tab 62. Matching holes 79 and 81 in tabs 60 and 62, respectively, and in the top and bottom region adjacent axial edges 54 and 56, are used to position the axial ends during the spot welding process. The inside diameter of the bottom 78 of the EMI and thermal shield 44 is 5.916, inches while the inside diameter of the top 80 of the EMI and thermal shield is 5.500 inches providing a slight inward taper toward the top of the EMI and thermal shield. This facilitates assembly while insuring a snug fit. The bottom 78 of the EMI and thermal shield can be readily slid over the smaller diameter bezel 50 of the register 10, to fit snugly around step 82 in the base 4 (best shown in FIG. 1), and with the smaller diameter top edge 80 fitting snugly around the bezel 50 when the EMI and thermal shield is slid all the way down to the groove in the base.

A generally rectangular shaped cutout 84 is provided for optical visibility of an optical bar code reading arrangement which is described in more detail in the afore-referenced co-pending patent application No. 411,934.

FIG. 3 is a cross-sectional view taken along lines 3—3 in FIG. 2. Referring to FIG. 3, it is to be noted that the offset 150 brings the tab 60 behind the axial edge 54 such that the outside surface of the EMI and thermal shield 44 in the region of axial edges 54 and 56 is substantially continuous, without an outside step which might otherwise result if there were a simple overlap of the ends. The formation of the offset 150 is facilitated through use of small notches such as 152 and 154 (shown in FIG. 2) at the juncture of the edge 54 and the outwardly extending edges of the tab 60. This facilitates the bending of the tabs without deforming the remainder of the EMI and thermal shield 44. Holes 79 assist in positioning the axial edges 54 and 56 during the spot welding process.

The EMI and thermal shield 44 includes 3 fasteners 90, 92 and 94 equally spaced about the circumference of the EMI and thermal shield, that is, spaced 120 degrees apart, for positive fastening of the heat shield about, and to, the transverse member 22 shown in FIG. 1. The spacing of the fasteners 90, 92 and 94, are shown in FIG. 4. In order to enhance the strength and rigidity of the EMI and thermal shield 44, the fasteners 90, 92 and 94, and optical cutout 84, are positioned and spaced from the seam 98 where the inner edges of tabs 60 and 62 underlie axial edge 56. The angle 102 between seam 98 and the center of fastener 90 is 40 degrees, while the angle 106 between seam 98 and the center of fastener 94 is 80 degrees. The angle 104 between the seam 98 and the closest edge 105 of the optical cutout 84 is 15.5 degrees and the arc 108 spanning the optical cutout 84 is 36 degrees. The direction of the grain of the stainless steel forming EMI and thermal shield 44 extends parallel to the bottom edge 78, that is, parallel to the base 4 and the register 10 to further facilitate bending the steel into the desired configuration.

The configuration of the fasteners 90, 92 and 94 are shown in FIGS. 5, 6 and 7. Referring to FIGS. 5, 6, and 7, and first to FIG. 5, it is seen that the fastener is formed by punching out a pair of Y-shaped segments 112A and 112B to form tooth 116 and tooth 118 with root space 120 therebetween, and having flatted ends 124 and 126, respectively The rounded tooth 130 is positioned opposite the root space 120 and is surrounded on either side by root spaces 134 and 136, which are the legs of the Y-shaped segments 112A and 112B. Thus, the spaced flatted teeth 116 and 118 are opposed by the generally rounded tooth 130.

The teeth 116, 118 and 130 are bent inwardly from the EMI and thermal shield 44 to form gripping surfaces for gripping the transverse support member 22 as shown in FIG. 6. Referring to FIG. 6, which is an enlarged cross-sectional view taken along the lines 6—6 in FIG. 5, tooth 118 and tooth 130 are bent inwardly from the side of the EMI and thermal shield 44. Tooth 130 is bent inwardly from the EMI and thermal shield at an angle 139 of 20 degrees, while tooth 118 is bent inwardly at an angle 140 of 12 degrees. A generally flatted portion 142 of tooth 118 extends inwardly 0.040 inches substantially perpendicular to the EMI and thermal shield 44. The distance between the flatted portion 142 of tooth 118 and the end 146 of rounded tooth 130 is 0.042±0.005 inches which is less than the thickness of the transverse support member 22 which is 0.044 inches thick.

In assembling the EMI and thermal shield 44, the shield is slid down and past register 10 with the enlarged bottom 78 passing freely past the register When the fasteners 90, 92 and 94 approach transverse support member 22, their inwardly extending rounded teeth, such as tooth 130, contact the edge of the transverse support member 22 and are pressed outwardly toward the EMI and thermal shield 44. Further movement downward of the EMI and thermal shield 44 moves the transverse support member 22 into contact with the flatted portions, such as 142 of the teeth 116 and 118, which act as resilient stops, at which time the resiliency of rounded tooth 130 forces the rounded tooth to spring inward under the support member securing the support member between the rounded tooth 130 and the flatted portion 142 of tooth 116. This action is repeated by all three of fasteners 90, 92 and 94 to secure the EMI and thermal shield 44 to the transverse support member 22, and to ground the shield through the metallic and conductive transverse support member which is grounded At the same time, the bottom 78 of the EMI and thermal shield 44 is firmly supported in the step 82 of base 4, and the narrower top 80 of the EMI and thermal shield securely surrounds bezel 50. Thus, the EMI and thermal shield 44 provides support to, and in turn, is supported by the base 4, the transverse member 22 and the bezel 50. The cutouts 158 at the top 80 of the EMI and thermal shield 44 facilitate the fastening of the nameplate (not shown) to bezel 50.

In a preferred embodiment of the present invention, the angular positioning of the EMI and thermal shield 44 on the electronic energy meter 2 is facilitated by the guide 160 (see FIG. 2) which extends upward from step 82 (see FIG. 1) and which is molded as part of base 4. A rectangular cutout 162 which is approximately twice the width, and approximately the same height, as guide 160 in the bottom edge 78 of the EMI and thermal shield 44 passes around the guide to provide the proper angular positioning. The EMI and thermal shield 44 is positioned and rotated about guide 160 with the assembled position of the EMI and thermal shield relative to the guide shown in FIG. 2. FIG. 7, shows the aluminum transverse support member 22. In the assembled position, the teeth 116, 118, and 130 of each fastener 90, 92 and 94 grip the circumferential area of the transverse support member 22 in the contact area regions 170, 172 and 174, respectively. The circumference 176 of the transverse support member 22 is generally circular in shape with a number of cutouts or notches such as notches 182, 184 and 186 adjacent contact areas 170, 172 and 174, respectively. Rotation of the EMI and thermal shield 44 in a counterclockwise direction rotates the teeth of fasteners 90, 92 and 94 out of frictional gripping engagement with the top and bottom of the transverse support member 22 by moving the bottom teeth 130 into the notches 182, 184 and 186, respectively, after which the EMI and thermal shield may be slid upward from around the base 14, electronic voltage assembly 14 and bezel 50.

Since the width of the cutout 162 is approximately twice that of the guide 160, it provides a positive stop for rotation of the EMI and thermal shield, first on one side 190 for the assembled position shown in FIG. 2, and then on the other side 192 when the side 194 of the cutout 162 of the EMI and thermal shield 44 is rotated in the counterclockwise direction to disengage the fasteners 90, 92 and 94 in preparation for removing the EMI and thermal shield Assembly of the EMI and thermal shield 44 can best be accomplished by a reversal of the procedure described above That is, the EMI and thermal shield is slid down over the bezel 50 and electronic voltage assembly to base 14 with the side 194 of cutout 162 adjacent the side 192 of guide 160 such that the bottom teeth 130 of fasteners 90, 92 and 94 are in the notches 182, 184 and 186, respectively, and out of contact with the transverse support member 22. After the EMI and thermal shield 44 is seated in the step 82, it is rotated clockwise so that the teeth 116, 118 and 130 are slid into frictional gripping engagement with the bottom and top of the transverse support member.

The close fit between the circular segments such as 176 of the EMI and thermal shield 44 and the planar transverse support member 22 provides strength and rigidity to the EMI and thermal shield and helps prevent denting of the relatively thin EMI and thermal shield when the energy meter 2 is handled or serviced with the cover 38 removed. The steel EMI and thermal shield 44 thus provides electromagnetic shielding by grounding through transverse support member 22, provides support and strength to the electronic energy meter 2, is thermally reflective, aesthetically covers and obscures the interior of the energy meter even with a transparent cover 38, and in addition provides a grounded safety shield when the cover is removed by a serviceman preventing the fingers of the serviceman from contacting the voltages present at many places within the electronic energy meter. Thus, while the invention has been described through preferred embodiments, such embodiments are provided by way of example only. Numerous variations, changes and substitutions, including those discussed above, will occur to those skilled in the art without departing from the scope of the present invention and following claims.

What we claim:

1. An electromagnetic interference and thermal shield for an electronic energy meter having a base adapted to be connected in circuit with an electric power source and a load to be metered, a register positioned above the base, a transparent housing, and electronic circuitry associated with said register comprising:
    a metallic shield in a generally tubular shape;
    said shield being a reflector of solar radiation and including a taper such that the internal diameter of the bottom of said shield is greater than the internal diameter of the top of said shield;
    a planar support member positioned between and substantially parallel to said base and said register;
    said shield being positioned within said housing around said electronic circuitry and extending from said base to said register; and
    one or more resilient fasteners positioned on said shield adapted to secure said shield to said planar support member;
    said shield being connected to the ground of said electronic circuitry when said shield is securely positioned around said register and on said base.

2. The electromagnetic and thermal shield for an electronic energy meter of claim 1 whereby each of said one or more resilient fasteners include opposed resilient extensions from said shield which grip opposite sides of said planar support member.

3. The electromagnetic and thermal shield for an electronic energy meter of claim 2 wherein said planar support member includes one or more arcuate sections which form at least one or more portions of a circle.

4. The electromagnetic and thermal shield for an electronic energy meter of claim 3 wherein said one or more resilient fasteners are positioned at said one or more arcuate sections.

5. The electromagnetic and thermal shield for an electronic energy meter of claim 4 wherein each of said one or more resilient fasteners include opposed tooth-shaped members.

6. The electromagnetic and thermal shield for an electronic energy meter of claim 5 wherein said tooth-shaped members extend inwardly from said electromagnetic and thermal shield.

7. The electromagnetic and thermal shield for an electronic energy meter of claim 6 wherein one or more of the ends of said tooth-shaped members includes a substantially flat portion extending substantially perpendicular to the surface of said shield, said substantially flat portion providing a stop for said shield upon contact with said planar support member when said electromagnetic and thermal shield is slid over said register to said base.

8. The electromagnetic and thermal shield for an electronic energy meter of claim 7 wherein the bottom of said electromagnetic and thermal shield surrounds a circular lip on said base which is within the portion of said base which supports said housing.

9. The electromagnetic and thermal shield for an electronic energy meter of claim 8 wherein said electromagnetic and thermal shield closely surrounds said register.

10. The electromagnetic and thermal shield for an electronic energy meter of claim 9 wherein said electromagnetic and thermal shield includes 3 spaced fasteners approximately 120 degrees apart.

11. The electromagnetic and thermal shield for an electronic energy meter of claim 10 wherein said tooth shaped members of said fasteners include two spaced upper teeth with flatted portions and a rounded bottom tooth, spaced from and opposing the space between said upper teeth.

12. The electromagnetic and thermal shield for an electronic energy meter of claim 11 wherein the shield provides support to the components of said electronic energy meter including said base, said planar support, and said register.

13. The electromagnetic and thermal shield for an electronic energy meter of claim 7 wherein said electromagnetic and thermal shield includes an axially extending seam substantially perpendicular to said planar support member.

14. The electromagnetic and thermal shield for an electronic energy meter of claim 13 wherein said seam is a welded seam, including one or more tabs extending from one edge under, and spot welded to, the other edge of said electromagnetic and thermal shield.

15. The electromagnetic and thermal shield for an electronic energy meter of claim 14 wherein said one or more tabs and said other edge of said electromagnetic and thermal shield include one or more matching holes to facilitate alignment during the spot welding.

16. The electromagnetic and thermal shield for an electronic energy meter of claim 15 wherein said one or more tabs each include an offset at said seam to provide a substantially continuous surface of said electromagnetic and thermal shield across the outer surface of said seam.

17. The electromagnetic and thermal shield for an electronic energy meter of claim 16 wherein small notches are provided in said one edge adjacent the edges of said tabs to facilitate the forming of said offset.

18. The electromagnetic and thermal shield for an electronic energy meter of claim 2 wherein said electromagnetic and thermal shield is stainless steel.

19. The electromagnetic and thermal shield for an electronic energy meter of claim 18 wherein said stainless steel is in the order of 10 mils thick.

20. An electromagnetic interference and thermal shield for an electronic energy meter of claim 2 wherein said planar support member is substantially circular and includes a plurality of notches and contact portions, one of said notches being adjacent each of said one or more fasteners, such that at least a portion of each fastener can be positioned in a notch adjacent thereto, and rotated to move said fasteners into frictional gripping engagement with said contact portions of said planar support member.

21. An electromagnetic interference and thermal shield for an electronic energy meter of claim 20 wherein a guide is provided in a circular portion of said base to cooperate with a cutout in the bottom of said electromagnetic and thermal shield to angularly position said contact portions of said planar support member.

22. An electromagnetic interference and thermal shield for an electronic energy meter of claim 21 wherein said cutout is in the order of twice the width of said guide to enable rotation of the bottom of said electromagnetic and thermal shield about said circular portion of said base about said guide.

23. An electromagnetic interference and thermal shield for an electronic energy meter of claim 22 wherein said electromagnetic and thermal shield may be positioned with said cutout surrounding said guide and at least a portion of each of said fasteners positioned within said notches and out of contact with said planar support member, and upon said rotation said fasteners frictionally grip said planar support member.

24. An electromagnetic interference and thermal shield for an electronic energy meter of claim 23 wherein said guide provides stops to the rotation of said electromagnetic and thermal shield with a first stop including at least a portion of each of said one or more fasteners within said notches and out of engagement with said planar support member, and a second stop with said one or more fasteners each frictionally gripping a contact portion of said planar support member.

25. An electromagnetic interference and thermal shield for an electronic energy meter of claim 24 wherein said first stop is provided by contact of one side of said cutout with one side of said guide, and said second stop is provided by contact of the other side of said cutout with the other side of said guide.

26. An electronic meter for the measurement of electric power including a base for connecting said meter in circuit with a source of electric power and an electrical load to be metered, an electronic register assembly substantially parallel to said base, an intermediate member substantially parallel to said base and said register, electronic circuitry positioned between said base and the top of said register assembly, and a transparent cover extending from said base and around said intermediate member and said register assembly comprising:

an electromagnetic and thermal tubular shield extending within said transparent cover between said base and said register assembly substantially obscuring the interior of said meter with the exception of the top region thereof;

said shield fitting firmly around a circular portion of said base and around said register assembly;

said shield being of material which reflects thermal radiation; and one or more fasteners positioned on said shield proximate to said intermediate member;

said intermediate member including one or more contact portions which extend through openings in said one or more fasteners;

said one or more fasteners including portions which frictionally engage said contact portions when said shield is positioned in said energy meter.

27. The energy meter of claim 26 wherein said fasteners include resilient teeth positioned on opposite sides of an opening into which said one or more contact portions extend.

28. The energy meter of claim 27 wherein said resilient teeth are integral with, and formed from, said tubular shield and extend inwardly from the surface of said shield.

29. The energy meter of claim 28 wherein said fasteners have one or more rounded teeth on an edge of said intermediate member closest to said base 30. The energy meter of claim 29 wherein the one or more teeth, which are opposite said one or more rounded teeth, are flatted, and include a tab which extends substantially parallel to said base and which cooperates with the top of said contact portions to position and secure said shield in said energy meter.

31. The energy meter of claim 30 wherein each of said fasteners include two upper flatted teeth and one lower rounded tooth.

32. The energy meter of claim 31 wherein said upper flatted teeth are spaced apart, and said lower tooth is positioned opposite the space between said upper flatted teeth.

33. The energy meter of claim 32 wherein said electronic circuitry includes a ground and said shield is connected through said intermediate member to said ground.

34. The energy meter of claim 33 wherein said shield is stainless steel in the order of 10 mils thick.

35. The energy meter of claim 34 wherein the direction of the grain of said stainless steel is parallel to said base.

36. The energy meter of claim 35 wherein said shield includes a seam extending axially between said base and said register.

37. The energy meter of claim 36 wherein said seam is a welded seam including one or more tabs extending from one edge under, and spot welded to, the other edge of said shield.

38. The energy meter of claim 37 wherein said one or more tabs and said other edge of said shield include one or more matching holes to facilitate alignment during the spot welding.

39. The energy meter of claim 38 wherein said one or more tabs each include an offset at said seam to provide a substantially continuous surface across the outer surface of said seam.

40. The energy meter of claim 39 wherein small notches are included in said one edge adjacent the juncture of said one edge with said one or more tabs to facilitate the forming of said offset.

41. The energy meter of claim 26 wherein said intermediate member is substantially circular and includes a plurality of notches, one of said notches being adjacent each of said one or more fasteners such that at least a portion of each fastener can be positioned in a notch adjacent thereto, and rotated to move said fasteners into frictional gripping engagement with said contact portions of said intermediate member.

42. The energy meter of claim 41 wherein a guide is provided in said circular portion of said base to cooperate with a cutout in the bottom of said electromagnetic and thermal shield to angularly position said fasteners relative to said contact portions of said intermediate member.

43. The energy meter of claim 42 wherein said cutout is in the order of twice the width of said guide to enable rotation of the bottom of said electromagnetic and thermal shield within said circular portion of said base about said guide.

44. The energy meter of claim 43 wherein said electromagnetic and thermal shield may be positioned with said cutout surrounding said guide and at least a portion of each of said fasteners positioned within said notches and out of contact with said intermediate support member, and upon said rotation said fasteners frictionally grip said intermediate member.

45. The energy meter of claim 44 wherein said guide provides stops to the rotation of said electromagnetic and thermal shield with a first stop including at least a portion of each of said one or more fasteners within said notches and out of gripping engagement with said intermediate member, and a second stop with said one or more fasteners each frictionally gripping a contact portion of said intermediate member.

46. The energy meter of claim 45 wherein said first stop is provided by contact of one side of said cutout with one side of said guide, and said second stop is provided by contact of the other side of said cutout with the other side of said guide.

* * * * *

UNITED STATES PATENT AND TRADEMARK OFFICE
CERTIFICATE OF CORRECTION

PATENT NO. : 5,027,061

DATED : June 25, 1991

INVENTOR(S) : Palmer, et al

It is certified that error appears in the above-identified patent and that said Letters Patent is hereby corrected as shown below:

On the title page, item [75] should read as follows:
--Ansell W. Palmer, Hampton; Peter F. Coryea, Salem; Michael A. Boutin, Derry, all of N.H.--

Signed and Sealed this

Twenty-third Day of February, 1993

Attest:

STEPHEN G. KUNIN

*Attesting Officer*         *Acting Commissioner of Patents and Trademarks*